(12) United States Patent
Pan

(10) Patent No.: US 11,700,798 B2
(45) Date of Patent: Jul. 18, 2023

(54) HIGH EFFICIENCY TRANSLUCENT SOLAR MODULE INTEGRATED WITH GREENHOUSE ROOF STRUCTURES

(71) Applicant: Wei Pan, Vancouver, WA (US)

(72) Inventor: Wei Pan, Vancouver, WA (US)

(73) Assignee: DWP Energy Solutions LLC, Vancouver, WA (US)

( * ) Notice: Subject to any disclaimer, the term of this patent is extended or adjusted under 35 U.S.C. 154(b) by 235 days.

(21) Appl. No.: 16/893,631

(22) Filed: Jun. 5, 2020

(65) Prior Publication Data

US 2020/0359571 A1 Nov. 19, 2020

Related U.S. Application Data

(63) Continuation-in-part of application No. 16/419,055, filed on May 22, 2019.

(Continued)

(51) Int. Cl.
| | | |
|---|---|---|
| *A01G 9/24* | (2006.01) | |
| *H02S 40/22* | (2014.01) | |

(Continued)

(52) U.S. Cl.
CPC .............. *A01G 9/243* (2013.01); *H02S 20/23* (2014.12); *H02S 30/10* (2014.12); *H02S 40/22* (2014.12); *A01G 9/14* (2013.01); *F21V 7/22* (2013.01); *F21V 9/04* (2013.01); *F21V 9/20* (2018.02); *F24S 25/61* (2018.05); *G01J 5/0814* (2022.01); *G02B 6/29361* (2013.01);

(Continued)

(58) Field of Classification Search
CPC ............. H01L 31/0547; H01L 31/0475; H01L 31/0504; H01L 31/0488; H01L 31/0549; H02S 40/22; H02S 30/10; H02S 20/23; H02S 30/00; H02S 40/42; A01G 9/243; A01G 9/14; F21V 7/22; F21V 9/04; F21V 9/20; F24S 25/61; G01J 5/0814; G02B 6/29361; G02B 27/141; G02B 2027/0114; G03B 33/12; Y02B 10/10; Y02E 10/52; Y02A 40/25; Y02P 60/12
See application file for complete search history.

(56) References Cited

U.S. PATENT DOCUMENTS

| 1,960,514 A | * | 5/1934 | Ross | G03B 33/16 |
| | | | | 359/503 |
| 2003/0201007 A1 | * | 10/2003 | Fraas | H01L 31/0504 |
| | | | | 136/246 |

(Continued)

FOREIGN PATENT DOCUMENTS

WO WO-2012167865 A1 * 12/2012 ............. C09D 5/004

OTHER PUBLICATIONS

Abrisa Technologies "High Performance Thin Film Optical Coatings Technical Capabilities" www.abrisatechnologies.com (Year: 2016).*

*Primary Examiner* — Michael Y Sun
(74) *Attorney, Agent, or Firm* — Joseph E. Maenner; Maenner & Associates, LLC

(57) ABSTRACT

A translucent solar module assembly for integration with a greenhouse having a frame with a plurality of roof supports includes a pair of brackets attachable to each of the plurality of roof supports, a bi-facial solar panel attachable to the pair of brackets, and a pair of reflector rails attachable to each of the plurality of roof supports. A dichroic reflector is attachable to the pair of reflector rails.

14 Claims, 9 Drawing Sheets

Related U.S. Application Data

(60) Provisional application No. 62/711,433, filed on Jul. 27, 2018.

(51) Int. Cl.
| | |
|---|---|
| *H02S 30/10* | (2014.01) |
| *H02S 20/23* | (2014.01) |
| *A01G 9/14* | (2006.01) |
| *F21V 7/22* | (2018.01) |
| *F21V 9/20* | (2018.01) |
| *F21V 9/04* | (2018.01) |
| *F24S 25/61* | (2018.01) |
| *G02B 6/293* | (2006.01) |
| *G01J 5/08* | (2022.01) |
| *G03B 33/12* | (2006.01) |
| *G02B 27/14* | (2006.01) |
| *G02B 27/01* | (2006.01) |
| *H01L 31/05* | (2014.01) |
| *H01L 31/054* | (2014.01) |
| *H01L 31/048* | (2014.01) |
| *H01L 31/0475* | (2014.01) |

(52) U.S. Cl.
CPC .... *G02B 27/141* (2013.01); *G02B 2027/0114* (2013.01); *G03B 33/12* (2013.01); *H01L 31/0475* (2014.12); *H01L 31/0488* (2013.01); *H01L 31/0504* (2013.01); *H01L 31/0549* (2014.12); *Y02B 10/10* (2013.01); *Y02E 10/52* (2013.01)

(56) References Cited

U.S. PATENT DOCUMENTS

| | | | | |
|---|---|---|---|---|
| 2011/0005128 | A1* | 1/2011 | Chuang | F24S 20/67 47/17 |
| 2011/0277819 | A1* | 11/2011 | Scheulov | H01L 31/046 136/246 |
| 2015/0349699 | A1* | 12/2015 | Chambe | H02S 20/30 136/246 |
| 2017/0202155 | A1* | 7/2017 | Iwai | A01G 7/045 |

* cited by examiner

HIGH EFFICIENCY TRANSLUCENT SOLAR MODULE INTEGRATED WITH GREENHOUSE ROOF STRUCTURES

CROSS-REFERENCE TO RELATED APPLICATIONS

The present application is a continuation-in-part of U.S. patent application Ser. No. 16/419,055, filed on May 22, 2019, which claims the benefit of U.S. Provisional Patent Application Ser. No. 62/711,433, filed on Jul. 27, 2018, both of which are incorporated herein by reference in their entireties.

STATEMENT OF GOVERNMENT INTEREST

This invention was made with Government support under DE-AR0000839 award by U.S. Department of Energy. The Government has certain rights in this invention.

BACKGROUND OF THE INVENTION

Field of the Invention

The present invention relates to solar module assemblies that can be mounted on greenhouse roofs.

Description of the Related Art

Green houses are used to grow plants and crops in a climate-controlled environment and are especially useful for growing crops and flowers year-round in an environment where the crops and flowers cannot grow naturally. Solar module assemblies are used to generate photovoltaic power directly from sunlight and can be used to provide electrical power to the greenhouse or other associated structures.

A drawback to using solar panel assemblies with greenhouses is the amount of area that must be dedicated to each. It would be beneficial to be able to provide the solar module assembly in such a way to generate photovoltaic power, yet still allow sufficient photosynthetic radiation to reach plants inside the greenhouse.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention is a translucent solar module assembly for integration with a greenhouse. The assembly has a frame with a plurality of roof supports includes a pair of brackets attachable to each of the plurality of roof supports, a bi-facial solar panel attachable to the pair of brackets, and a pair of reflector rails attachable to each of the plurality of roof supports. A dichroic reflector is attachable to the pair of reflector rails.

In another embodiment, the present invention is a greenhouse comprising a plurality of roof supports, a pair of brackets attached to each of the plurality of roof supports, and a bi-facial solar panel attached to the pair of brackets. A pair of reflector rails is attached to each of the plurality of roof supports and a dichroic reflector is attached to the pair of reflector rails.

BRIEF DESCRIPTION OF THE DRAWINGS

The accompanying drawings, which are incorporated herein and constitute part of this specification, illustrate the presently preferred embodiments of the invention, and, together with the general description given above and the detailed description given below, serve to explain the features of the invention. In the drawings.

DETAILED DESCRIPTION

Figure 1:
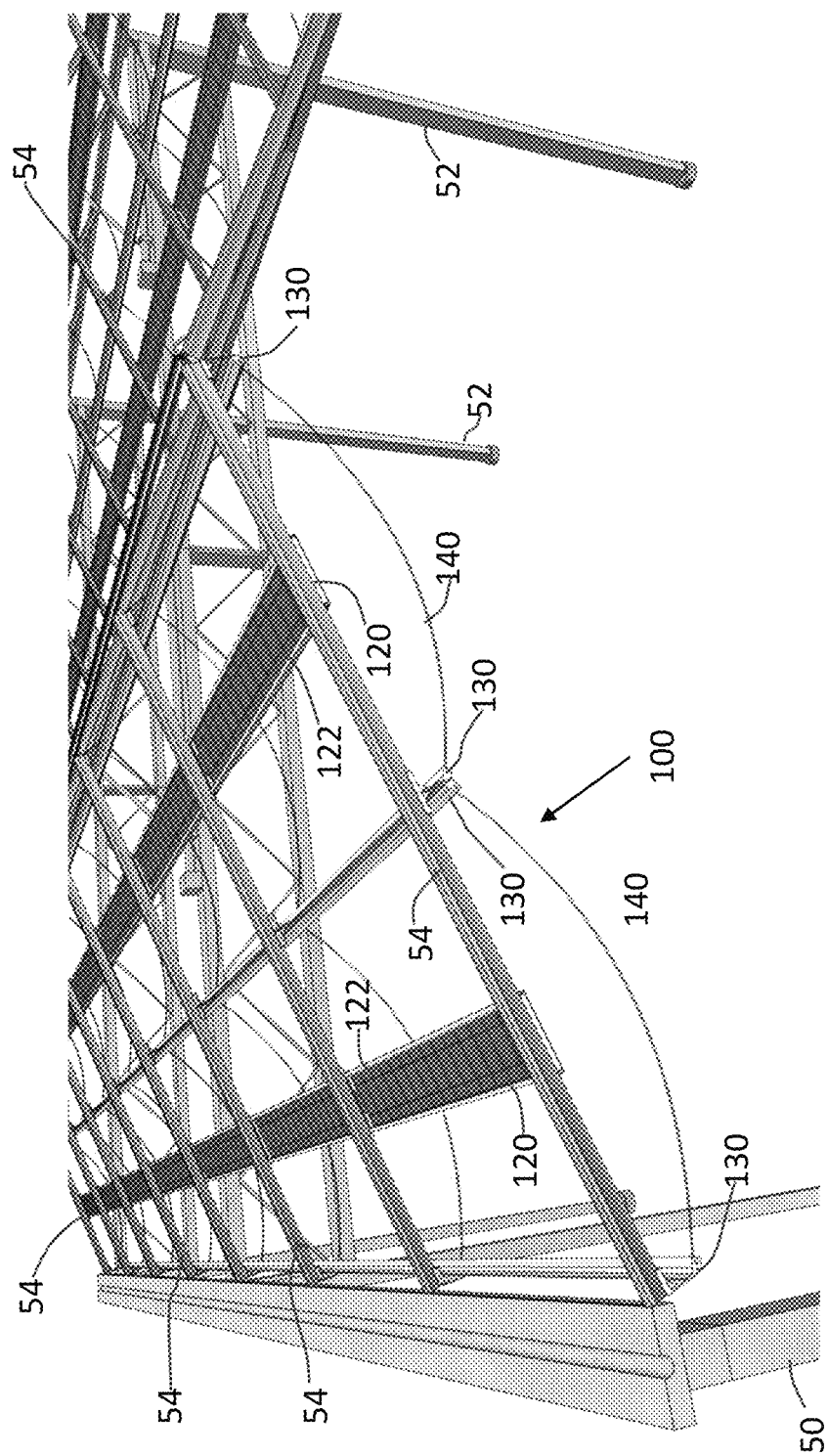
FIG. 1 is a perspective view of a solar panel assembly according to an exemplary embodiment of the present invention mounted on a greenhouse roof structure.
Figure 2:
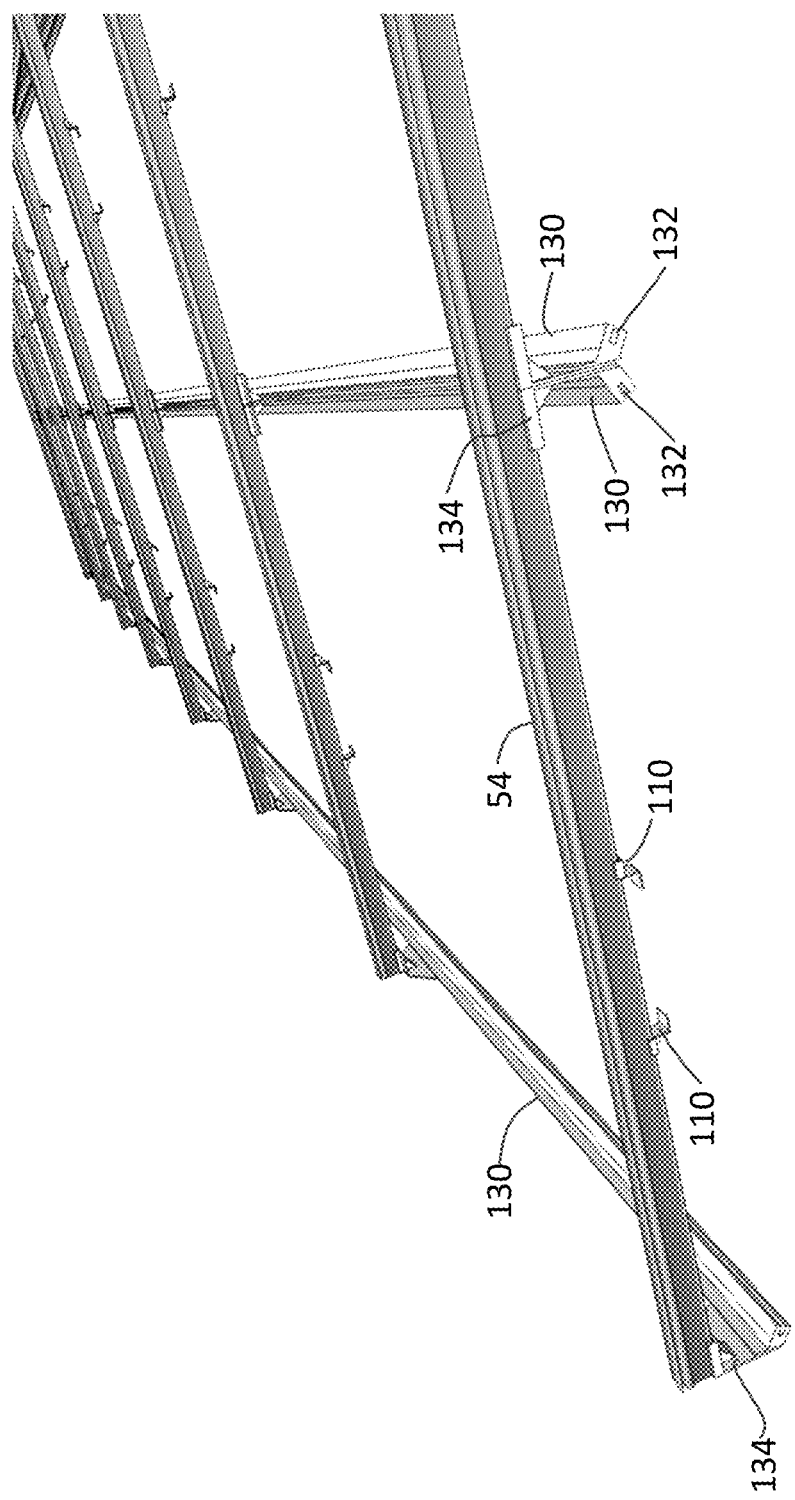
FIG. 2 is a perspective view of brackets and rails used to support the solar panel assembly of FIG. 1.

In the drawings, like numerals indicate like elements throughout. Certain terminology is used herein for convenience only and is not to be taken as a limitation on the present invention. The terminology includes the words specifically mentioned, derivatives thereof and words of similar import. The embodiments illustrated below are not intended to be exhaustive or to limit the invention to the precise form disclosed. These embodiments are chosen and described to best explain the principle of the invention and its application and practical use and to enable others skilled in the art to best utilize the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary"

is not necessarily to be construed as preferred or advantageous over other aspects or designs. Rather, use of the word exemplary is intended to present concepts in a concrete fashion.

The word "about" is used herein to include a value of +/−10 percent of the numerical value modified by the word "about" and the word "generally" is used herein to mean "without regard to particulars or exceptions."

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The present invention provides a bifacial solar panel assembly with a dichroic reflector mounted below the solar panel assembly such that incident light within a predetermined wavelength range is reflected by the reflector onto a back face of the bifacial solar panel assembly and the remaining incident light passes through the reflector. The assembly can be mounted onto the roof of a greenhouse such that the no-reflected light transmits into the greenhouse.

Referring to FIGS. 1-4, a bifacial solar panel assembly 100 ("assembly 100") according to an exemplary embodiment of the present invention is shown). Assembly 100 can be mounted onto an existing greenhouse 50 having a frame 52 with a plurality of roof supports 54 or assembly 100 can be incorporated into a new construction greenhouse. Assembly 100 can be attached on to the ridges and sashes of the greenhouse to save the installation cost and minimize structural materials used.

The bi-facial Si panel contains a string of bi-facial half cells connected in series. Each half cell has an open circuit voltage of 0.698V, short circuit current of 4.921 A, a fill factor of 82.4%, and mechanical dimensions of 157.4 mm×78.6 mm. The bi-faciality factor for the panels is more than 85%. Further, the panel is a single glass pane panel to reduce the panel weight.

The translucent dichroic reflector has a two-dimensional cross section defined by a conic function, preferably to have a simple or compound hyperbola and/or parabola shape. It is linear in the third dimension. The dichroic reflector reflects and concentrates NIR light (700 nm to 1100 nm) to the back face of bi-facial panel, while passing the rest solar irradiation, including visible (400 nm to 700 nm) and IR (1100 nm to 2500 nm).

The shape of the reflector is designed in such that the field of view (FOV) is larger than the daily and seasonal sun's elevation angle variation range at the geo-location to ensure the reflected NIR light can reach the back face of the panel all-day in any season.

Assembly 100 includes brackets 110 attachable to each of the plurality of roof supports 54. Brackets 110 are provided in pairs such that a bi-facial solar panel 120 ("panel 120") is slidable along and is attachable to the pair of brackets 110.

Each pair of brackets 110 is aligned with other pairs of brackets 110 mounted on adjacent roof supports 54 so that panels 120 can be supported along their lengths so that panels 120 can extend along a length of greenhouse 50.

Figure 3:
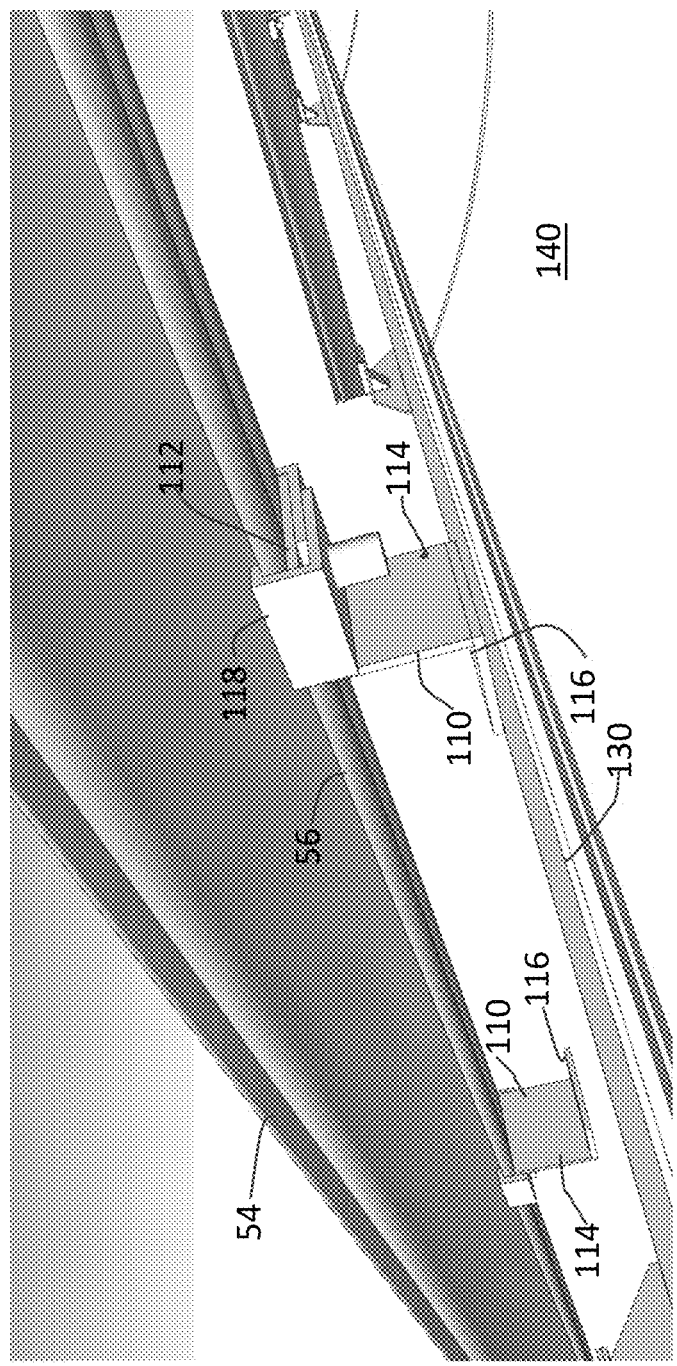
FIG. 3 is an enlarged perspective view of the brackets of FIG. 2 mounted on a greenhouse roof support.
Figure 4:
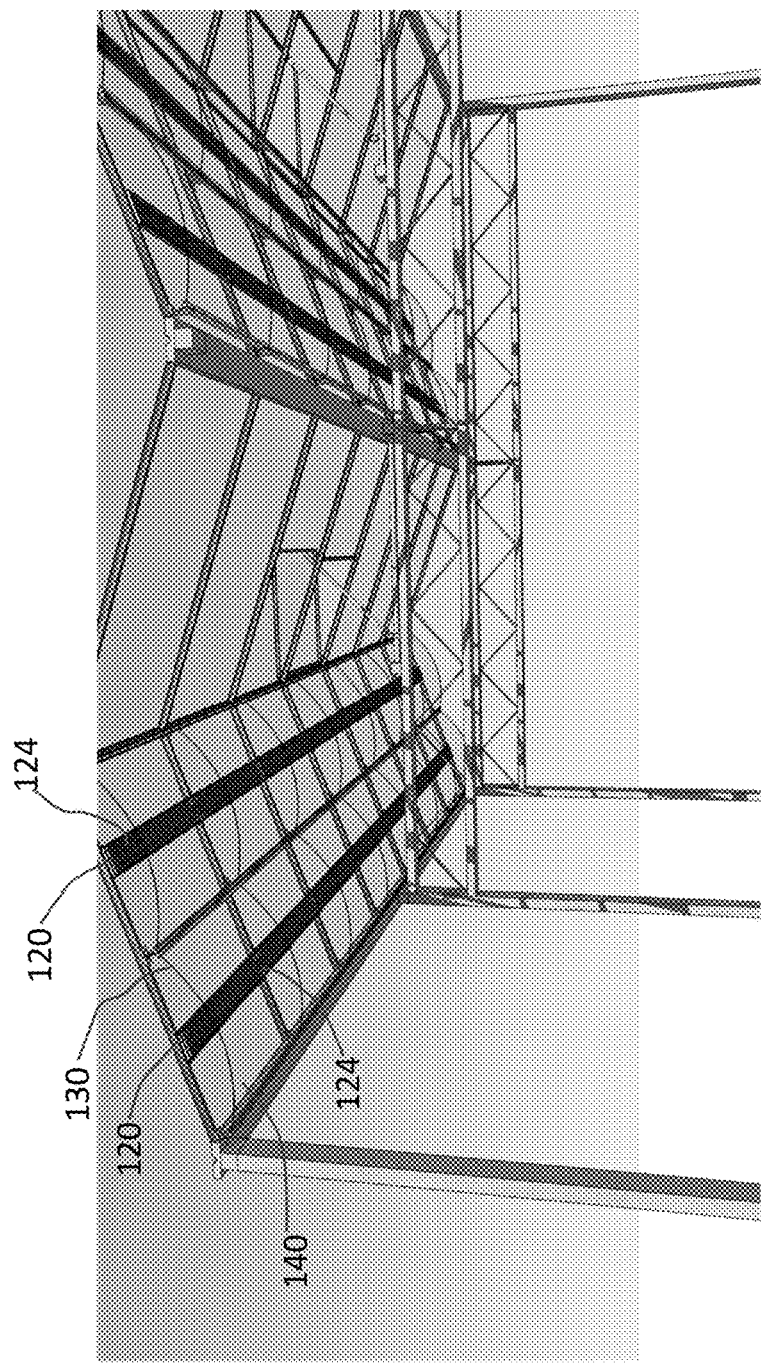
FIG. 4 is a bottom perspective view of the assembly of FIG. 1 mounted on the greenhouse roof structure.

Referring to FIG. 3, each bracket 110 is generally "S" shaped with a top leg 112 configured to engage a bottom flange 56 of a roof support 54. A rib 114 extends downwardly from top leg 112 to a bottom leg 116. Bottom legs 116 extend generally parallel to bottom flange 56 and, for each pair of brackets 110, each bottom leg 116 faces the bottom leg 116 on the other bracket 110 such that panels 120 can slide along and be vertically supported by bottom legs 116 of a pair of brackets 110. A beam clamp 118 can be used to connect top leg 112 to bottom flange 56.

Panels 120 include a front face 122 that absorbs solar energy directly, and a back face 124 that absorbs reflected solar energy. In an exemplary embodiment, each panel 120 has a bifaciality factor of at least 85%, meaning that back face 124 converts at least 85% of the incoming solar energy to the back face into electricity. In an exemplary embodiment, each panel 120 contains a string of bi-facial half cells connected in series. Each half cell has an open circuit voltage of 0.698V, a short circuit current of 4.921 A, a fill factor of 82.4%, and mechanical dimensions of 157.4 mm×78.6 mm. Further, panel 120 can be a single glass pane panel to reduce the panel weight.

A dichroic reflector 140 is mounted below each panel 120 such that reflector 140 can reflect light incident on reflector 140 to back face 124 of panel 120. For each reflector 140, a pair of reflector rails 130 are attachable to each of the plurality of roof supports 54 such that reflector rails 130 extend generally orthogonally relative to roof supports 54 and generally the length of greenhouse 50. Each pair of brackets 110 is attachable between a respective pair of reflector rails 130 such that a panel 120 is located over each reflector 140.

Reflector 140 is slidable along the pair of reflector rails 130 such that reflector 140 extends generally the length of greenhouse 50. Reflector 140 has a width larger than a distance between the pair of reflector rails 130 such that reflector 140 has an arcuate cross section.

Each rail 130 has a generally "C-shaped" cross section with a slot 132 sized to receive an edge of a reflector 140. Rails 130 are attached to brackets 134 that in turn are attached to a roof support 54. Each bracket 134 can include a first rail 130 for supporting a first reflector 140 and a second rail 130 for supporting a second reflector 140. Rail 130 is angled with respect to bracket 134 such that sloe 132 extends along an oblique angle relative to vertical.

Reflector 140 has a two-dimensional cross section defined by a conic function, preferably to have a simple or compound hyperbolic and/or a parabolic shape. Reflector 140 is linear in the third dimension along the length of greenhouse 50. Reflector 140 reflects and concentrates NIR light (700 nm to 1100 nm) to back face 124 of panel 120, while passing the rest of the incident solar irradiation, including visible (400 nm to 700 nm) and IR (1100 nm to 2500 nm) to growing crops inside greenhouse 50.

In an exemplary embodiment, a width of panel 120 can be between about 14% and about 50% of a width between a pair of adjacent reflector rails 130 when the reflector rails 130 are attached to the roof supports 54.

The shape of reflector 140 is designed in such that the field of view (FOV) is larger than the daily and seasonal sun's elevation angle variation range at the geo-location to ensure the reflected NIR light can reach back face 124 of panel 120 all-day in any season.

Figure 7:
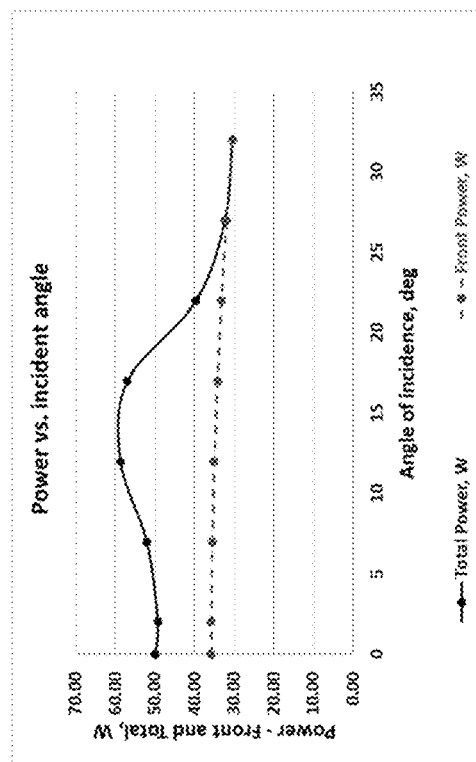
FIG. 7 is a graph showing the measured photovoltaic power vs. incident angle of the sunlight in one of the embodiments for the assembly of FIG. 1.

In an exemplary embodiment shown in FIG. 7, electrical power generated by assembly 100 solar panel can be about 63% more than a comparable sized mono-facial solar panel of similar construction.

Figure 5:
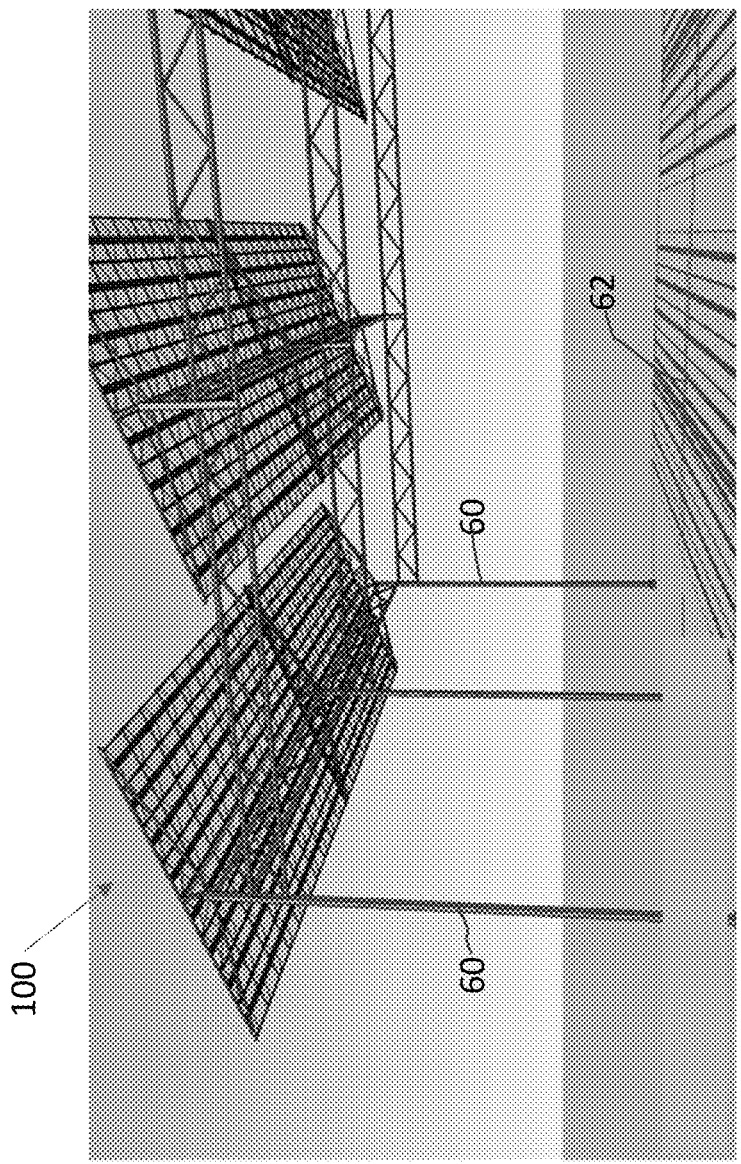
FIG. 5 is a perspective view of the solar panel assembly of FIG. 1 mounted on a structure over an open field.

While FIGS. 1-4 show assembly 100 used for greenhouse 50, FIG. 5 shows assembly 100 used in an open field design, with an open structure 60 supporting assembly 100 over a field 62.

In order to optimize the amount of photovoltaic power that can be generated by assembly 100, one must consider the geo-location where assembly 100 will be installed, the greenhouse roof tilt, and the photosynthetic active radiation ("PAR") requirement defined by the grower for the crops that are being grown. PAR, aka visible light, usually has a wavelength between 400 and 700 nm. This band of sunlight drives photosynthetic reactions in plants. In the standard one sun illumination, PAR has 2121 μmol/sec/m² of photons. Furthermore, since assembly 100 is stationary while the sun moves across the sky daily, the design must have a large field of view ("FOV") so that NIR light can be collected efficiently.

Module Simulation

A simulation based on the mechanical dimensions using the following formulations can predict or determine the amount of photocurrent received by both front face 122 and back face 124 of panel 120.

$$\text{Total Power, } P_T(W/m^2) = \text{Power from Front, } P_F(W/m^2) + \text{Power from Back, } P_B(W/m^2) \; P_F(W/m^2) =$$
$$(\text{Sum of Photons} < 1100 \text{ nm})*(1-L_o)$$
$$*f*EQE*q*Voc*FF \; P_B(W/M^2) = (\text{Sum of Photons } 700\text{-}1100 \text{ nm})*(1-L_R-L_o)*(1-S)$$
$$*EQE*q*Voc*BF*FF1)$$

Where, $L_o$ is the optical loss from air-glass interface, mostly reflective loss;

S is the fraction of area covered by a photo-voltaic ("PV") panel in the unit area. Thus, 1−S denotes the open area;

EQE stands for external quantum efficiency, which describes the ability of converting photons into electron-hole pair of a PV material;

q is the electron charge, equals to 1.6E−19 Coulomb;

Voc is the open circuit voltage of a PV panel;

FF is the panel fill factor, describes resistive losses of a PV panel;

$L_R$ is the optical loss associated with the reflector, such as reflective loss, optical errors induced loss, etc. It corelates to the reflector's light collection efficiency shown in FIG. 12;

BF is the bifaciality factor of a bi-facial panel and describes the differences of conversion efficiency between the front side and the backside of a PV panel.

Simulation and Test Results

Figure 6:
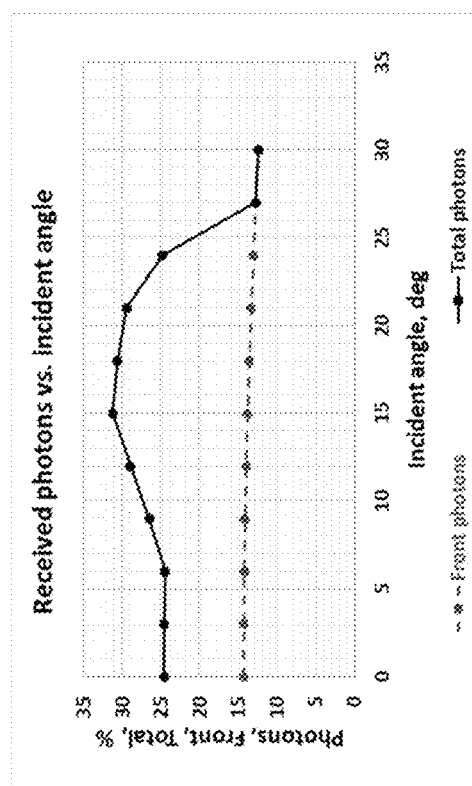
FIG. 6 is a graph showing the simulated photocurrent vs. incident angle for the solar panel assembly of FIG. 1.

The simulation predicted the photons received by both front and back faces. Later a prototype of an assembly 100 was measured under the sun. The graphs of FIGS. 6 and 7 show well-matched performances. From the test results, one can see that assembly 100 boosts PV output peak power by 63% as compared to simply lay Si panels on a roof. In other words, the NIR contributes 63% more PV power. In the meantime, assembly 100 has a FOV of +/−27°, much larger than the daily and seasonal suns' altitude range to accommodate the sun's motion in the sky. Referring to FIGS. 6 and 7, the amount of optical energy absorbed by the back of the solar panel is reduced to zero beyond the incident angle of 27°, suggesting that the reflector cannot reflect any light back to the bi-facial panel beyond 27°. While the reflector still reflects light, the reflected light would miss the panel.

Figure 8:
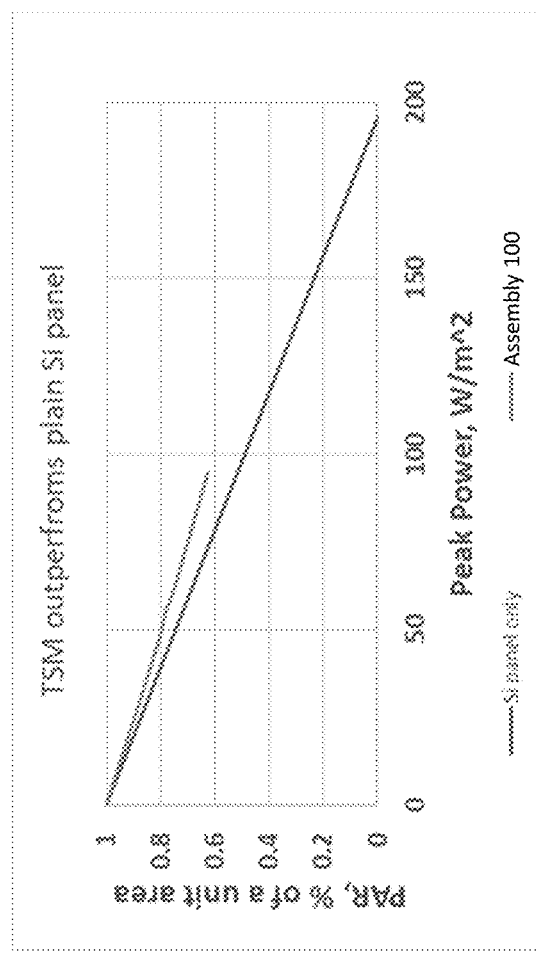
FIG. 8 is a graph of exemplary photosynthetic active radiation vs. peak power for the assembly of FIG. 1.

PAR and PV energy are competing factors when comes to covering the roof of a greenhouse with solar panels; more energy can be generated with the expense of less PAR. They usually move in a linear line, as shown below. Assembly 100, however, breaks out of the linear line, which indicates that for a given PAR, assembly 100 can produce more power and for a given power, assembly 100 can allow more PAR down to crops. FIG. 8 shows the difference in output electrical power for a monofacial silicon solar panel vs. assembly 100.

Figure 12:
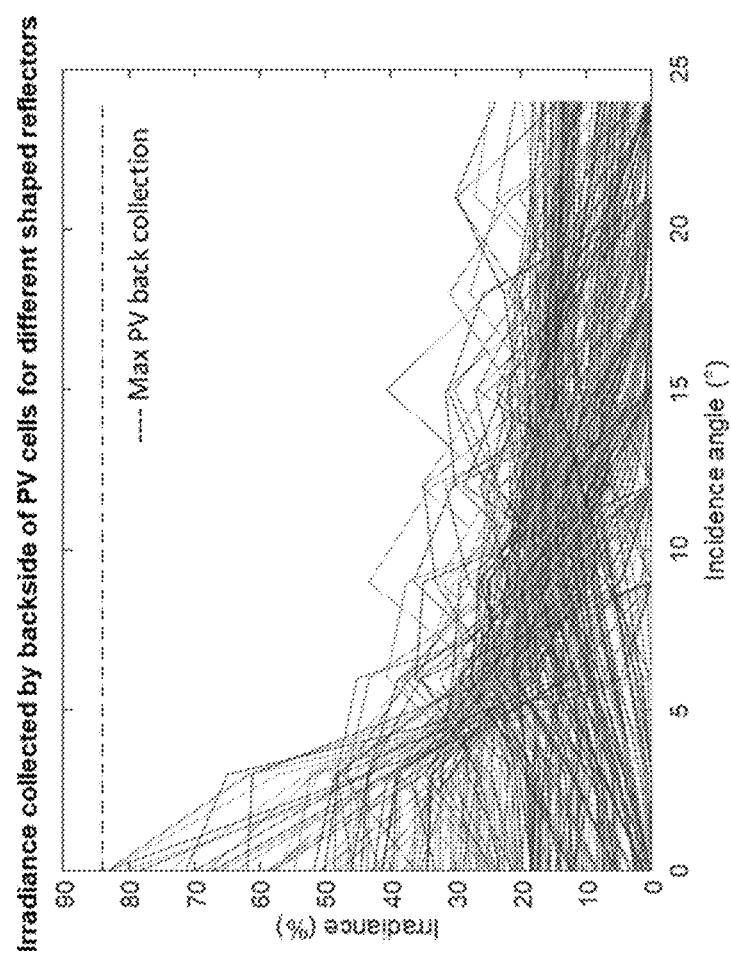
FIG. 12 is a plot of reflector's light collection efficiency versus light incident angles. Each line in the plot is generated through optical simulation and represents a reflector shape defined by a set of parameters shown in FIG. 9.
Figure 9:
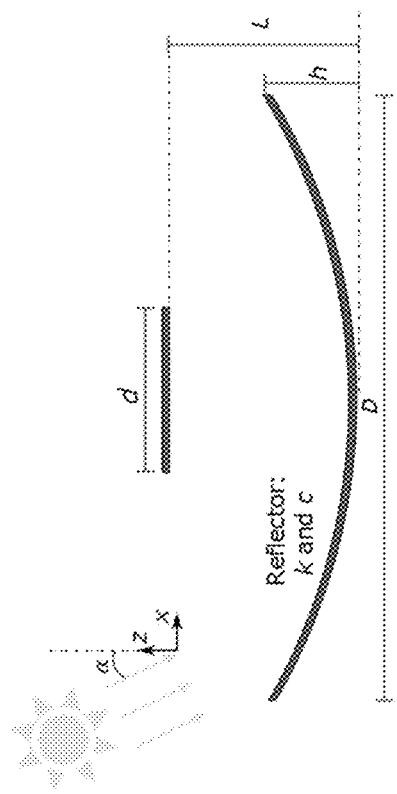
FIG. 9 is a diagram showing an exemplary set of parameters defined to be used in the optical simulation to determine backside near infrared light collection efficiency of a reflector used in the assembly of FIG. 1.
Figures 10, 11:
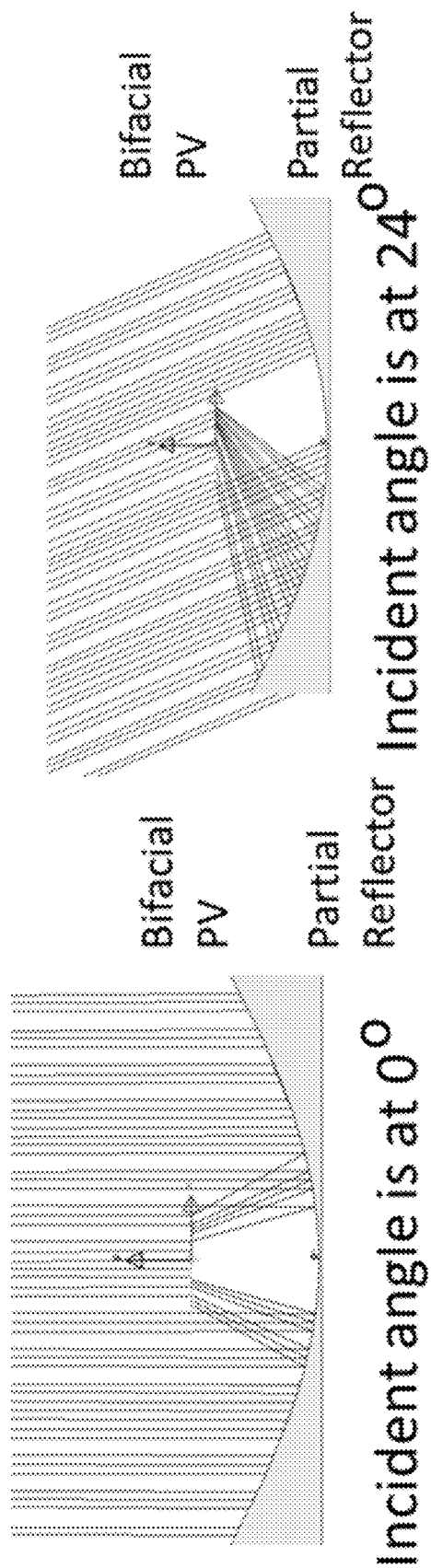
FIG. 10 is an exemplary illustration of the incident sunlight on a translucent solar module assembly of FIG. 1 with the incident angle at 0°.
FIG. 11 is an exemplary illustration of the incident sunlight on a translucent solar module assembly of FIG. 1 with the incident angle at 24°.

Based on configurations for an exemplary assembly 100 shown in FIGS. 10-12, an optical model was established in the LightTools software platform. The parameters shown in FIG. 9 are defined as:

"d" is the width of a bi-facial solar panel.

D is the cross-sectional width of a dichroic reflector.

S=d/D indicates the aperture ratio, which is usually given by the users because it dictates the available PAR under assembly 100.

L is the distance between bi-facial PV panel and the apex point of the reflector. This is an important parameter when comes to physical area constrains in actual applications. It is typically desired to keep L short for various aesthetic and structural reasons.

"k" and "c" are the geometric terms, curvature and conic constants, respectively, of the reflector. If the reflector itself has one conic cross-section, only one set of k and c is provided. If the reflector is composed of plural number of conic cross-sections (referred to as a compound reflector), multiple sets of k and c are provided.

"h" is the height of the reflector edge relative to the center point. This is also a parameter may be subjected to the physical area constrains. It can be simply defined as "Bowness" of the reflector.

Besides the mechanical parameters, the optical model uses AM1.5 solar spectrum as the solar source. The reflector was treated as an ideal perfect mirror in the model, and the bi-facial solar cells were treated as ideal optical absorbers.

The purpose of the optical simulation is to find the best backside NIR light collection efficiency ($\eta_c$) of a reflector at given S ratios and FOV ranges, i.e. the maximum fraction of incident light can be collected by the backside of solar cells. The targeted FOV is ±23.5° as this is the solar altitude angle seasonal variability for the assembly 100 tilted at latitude angle. Thus, at given S and FOV, the non-sequential ray-tracing Synopsys LightTools executes the following steps:

At each set of the mechanical parameters: f, L, and h (or the k and c), the incident sunlight was tilted by an angle from the z-axis. The angle α is then stepped from 0° to 30°.

The fraction of the incident light collected ($\eta_c$) at the back face is then recorded with respect to the set of parameters. Two ray-tracing plots are shown in FIGS. 10 and 11.

The simulation process can then be repeated for another set of parameters until the full ranges of the parameters are explored. After running through hundreds set of parameters, the backside collection efficiencies are plotted against the incident angle, shown in FIG. 12 in which each line represents one set of reflector parameters.

One can see from the $\eta_c$ vs. incident angle plots of FIG. 12 that the dependence of $\eta_c$ as well as the FOV on the shape of the reflector is very strong. In order to select the right set of parameters (i.e. the shape of the reflector), a merit function is imposed onto the simulated results. The merit function contains FOV requirement, the best energy outputs criteria, orientation of the assembly and tilt angle. Thus, an optimized shape of the reflector is selected by applying the merit function at a given S ratio. One example of the reflector's collecting efficiency plot for S=⅐, is shown in FIG. 6. FIG. 12 depicts hundreds of reflector shapes. Using the merit function, many of those shapes are dismissed due to small FOV or low total energy outputs. That would leave a much smaller subset of preferred shapes; one of them is shown in FIG. 6, in which reflector's collection efficiency is expressed as received photons (front and total) as a percentage of total available photons incident onto an unit area.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A greenhouse comprising:
    a plurality of roof supports;
    a pair of brackets suspended underneath each of the plurality of roof supports;
    a bi-facial solar panel attached to the pair of brackets underneath the plurality of roof supports;
    a pair of reflector rails suspended underneath each of the plurality of roof supports; and
    a dichroic reflector attached to the pair of reflector rails, the dichroic reflector being directly below the bi-facial solar panel,
    wherein the dichroic reflector maintains a space from the bi-facial solar panel
    wherein the dichroic reflector is configured to concentrate and reflect solar irradiation having a selective wavelength band between about 700 nanometers and about 1100 nanometers, and wherein the dichroic reflector is further configured to pass incident solar irradiation having a wavelength shorter than about 700 and longer than 1100 nanometers to pass through the dichroic reflector.

2. The greenhouse according to claim 1, wherein each of the pair of brackets is attached between the pair of reflector rails.

3. The greenhouse according to claim 1, wherein the pair of reflector rails extend between adjacent roof supports of the plurality of roof supports.

4. The greenhouse according to claim 1, wherein a width of the bi-facial solar panel is between about 14% and about 50% of a width between the pair of reflector rails.

5. The greenhouse according to claim 1, wherein the bi-facial solar panel comprises a string of bi-facial half cells connected in series.

6. The greenhouse according to claim 1, wherein the dichroic reflector has a width larger than a distance between the pair of reflector rails.

7. The greenhouse according to claim 1, wherein the dichroic reflector has an arcuate cross section.

8. The greenhouse according to claim 1, wherein the dichroic reflector is slidable along the pair of reflector rails.

9. The greenhouse according to claim 1, wherein the bi-facial solar panel is slidable along the pair of brackets.

10. The greenhouse according to claim 1, wherein the bi-facial solar panel plus the dichroic reflector has a field of view larger than a daily and seasonal elevation angle range of the sun at a location of the greenhouse.

11. The greenhouse according to claim 1, wherein the bi-facial solar panel has a bifaciality factor of at least 85%.

12. The greenhouse according to claim 1, wherein a width of the bi-facial solar panel is between about 14% and about 50% of a width between the pair of reflector rails when the reflector rails are attached to the roof supports.

13. The greenhouse according to claim 10, wherein the field of view is ±23.5°.

14. A greenhouse comprising:
    a plurality of roof supports:
    a pair of brackets fixedly attached to and extending downwardly from each of the plurality of roof supports each of the pair of brackets comprising:
    a top leg engaged with at least one of the plurality of roof supports;
    a rib extending downwardly from each top leg; and
    a bottom leg extending from each rib such that each bottom leg of each bracket of the pair of brackets faces the bottom leg of the other bracket of the pair of brackets;
    a bi-facial solar panel supported by the bottom leg of each of the pair of brackets;
    a rail bracket fixedly attached to and extending downwardly from the plurality of roof supports;
    a pair of reflector rails attached to the rail bracket, each of the pair of reflector rails having a generally C-shaped cross section having a slot formed therein; and
    a separate dichroic reflector attached to each of the pair of reflector rails such that an edge of each dichroic reflector is inserted into the slot of one of the pair of reflector rails,
    wherein the pair of brackets is attached to a respective one of the plurality of roof supports such that the pair of brackets is between the pair of reflector rails such that the bi-facial solar panel is directly above the dichroic reflector.

* * * * *